United States Patent
Liu et al.

(10) Patent No.: US 8,671,570 B2
(45) Date of Patent: Mar. 18, 2014

(54) VAPOR CHAMBER AND METHOD FOR MANUFACTURING THE SAME

(75) Inventors: Juei-Khai Liu, Taipei (TW); Chao-Tsai Chung, Taipei (TW)

(73) Assignee: Pegatron Corporation, Beitou District, Taipei (TW)

( * ) Notice: Subject to any disclaimer, the term of this patent is extended or adjusted under 35 U.S.C. 154(b) by 554 days.

(21) Appl. No.: 12/910,871

(22) Filed: Oct. 25, 2010

(65) Prior Publication Data

US 2011/0174474 A1     Jul. 21, 2011

(30) Foreign Application Priority Data

Jan. 20, 2010 (TW) ............................... 99101497 A (51) Int. Cl.
*B23P 15/26* (2006.01)
*H05K 7/20* (2006.01)
*F28D 15/04* (2006.01)

(52) U.S. Cl.
USPC ............ 29/890.032; 165/104.26; 361/679.52; 361/700

(58) Field of Classification Search
USPC .......... 165/104.26, 104.33, 80.3; 361/679.52, 361/700; 29/890.032
See application file for complete search history.

(56) References Cited

U.S. PATENT DOCUMENTS

| | | | |
|---|---|---|---|
| 3,554,183 A * | 1/1971 | Grover et al. ............ | 165/104.26 |
| 3,948,316 A * | 4/1976 | Souriau .................... | 165/104.26 |
| 4,437,217 A | 3/1984 | Lallaye | |
| 4,697,205 A * | 9/1987 | Eastman ................... | 257/715 |
| 5,283,715 A * | 2/1994 | Carlsten et al. ........... | 361/702 |
| 5,334,429 A * | 8/1994 | Imoto et al. ............... | 428/36.2 |
| 6,330,907 B1 * | 12/2001 | Ogushi et al. ............ | 165/104.26 |
| 6,418,017 B1 * | 7/2002 | Patel et al. ................ | 361/700 |
| 6,460,612 B1 * | 10/2002 | Sehmbey et al. ......... | 165/104.26 |
| 6,795,310 B2 * | 9/2004 | Ghosh ....................... | 361/679.53 |
| 6,994,151 B2 * | 2/2006 | Zhou et al. ................ | 165/80.4 |
| 7,028,759 B2 * | 4/2006 | Rosenfeld et al. ........ | 165/104.26 |
| 7,237,337 B2 * | 7/2007 | Yeh et al. ................. | 29/890.032 |
| 7,726,384 B2 * | 6/2010 | Hou et al. ................. | 165/104.26 |
| 7,828,046 B2 * | 11/2010 | Huang et al. ............. | 165/104.26 |
| 7,881,059 B2 * | 2/2011 | Hosking .................... | 361/700 |
| 8,081,461 B2 * | 12/2011 | Campbell et al. ......... | 361/700 |

(Continued)

FOREIGN PATENT DOCUMENTS

| | | |
|---|---|---|
| CN | 2790105 Y | 6/2006 |
| JP | 11304381 | 11/1999 |
| TW | 218421 | 1/1994 |
| TW | 200604482 | 2/2006 |

OTHER PUBLICATIONS

Accuratus, Boron Nitride, Apr. 7, 2004, p. 2.*
Accuratus, Aluminum Nitride, Jul. 23, 2007, p. 1.*

*Primary Examiner* — Leonard R Leo
(74) *Attorney, Agent, or Firm* — Winston Hsu; Scott Margo (57) ABSTRACT

The vapor chamber is used in an electronic device. The electronic device includes a metal casing. The vapor chamber includes an upper cover, a working fluid, a waterproof layer, and a wick structure layer. The upper cover is disposed on inner walls of the metal casing to define a containing space. The working fluid is filled into the containing space. The waterproof layer is formed on inner walls of the containing space. The wick structure layer is formed on the waterproof layer.

19 Claims, 5 Drawing Sheets

(56) References Cited

U.S. PATENT DOCUMENTS

| | | | |
|---|---|---|---|
| 2003/0075306 A1* | 4/2003 | Zuo et al. | 165/104.26 |
| 2005/0241817 A1 | 11/2005 | Moore | |
| 2005/0269065 A1* | 12/2005 | Chen | 165/104.26 |
| 2006/0219391 A1* | 10/2006 | Hong et al. | 165/104.26 |
| 2006/0283575 A1* | 12/2006 | Pai | 165/104.26 |
| 2007/0034357 A1* | 2/2007 | Hou et al. | 165/104.26 |
| 2007/0267180 A1* | 11/2007 | Asfia et al. | 165/104.26 |
| 2008/0053640 A1 | 3/2008 | Mok | |
| 2010/0254090 A1* | 10/2010 | Trautman | 165/104.26 |
| 2010/0294475 A1* | 11/2010 | Rush et al. | 165/185 |
| 2011/0108142 A1* | 5/2011 | Liu et al. | 137/561 R |

\* cited by examiner

VAPOR CHAMBER AND METHOD FOR MANUFACTURING THE SAME

CROSS-REFERENCE TO RELATED APPLICATIONS

This Non-provisional application claims priority under 35 U.S.C. §119(a) on Patent Application No(s). 099101497 filed in Taiwan, Republic of China Jan. 20, 2010, the entire contents of which are hereby incorporated by reference.

BACKGROUND OF THE INVENTION

1. Field of the Invention

This invention relates to heat dissipation and, more particularly, to a vapor chamber effectively saving a cost of thermal interface materials and a base of the vapor chamber and a method for manufacturing the same.

2. Description of the Related Art

In recent years, heat dissipation of the electronic device is gradually interested as an electronic device is gradually developed to be light, slim, short, and small. Particularly, present consuming electronic products, such as a digital camera, a cell phone, a notebook computer and so on, have more complicated functions and include more and more power transistor elements. Therefore, an inner space of a casing becomes smaller, and fans are limited in order to reduce noise so that thermal management of the electronic devices becomes more and more serious and needs to be solved.

A casing of the electronic device is mostly made of aluminum-magnesium alloy in order to allow the power transistor elements of the electronic device to run at a normal operating temperature to maintain a normal lifespan thereof. Further, heat generated by the power transistor elements of the electronic device is transferred to the metal casing via a thermal interface material (TIM), such as a thermal grease and thermal pad, and a thermal conducting element, such as a heat pipe, a vapor chamber, a loop heat pipe and so on. The temperature of the power transistor elements can be effectively reduced to dissipate the heat because the metal casing has a great heat dissipating area.

In most heat dissipating devices, a vapor chamber (also called flat plate heat pipe) has excellent transverse and longitudinal thermal conduction characteristics. Therefore, the vapor chamber is widely used as a heat dissipating device of an electronic device, such as a central processing unit, a graphic processing unit, a high power transistor, a high power light-emitting diode and so on, thereby ensuring that the electronic device can work in a normal state and can avoid a breakdown caused by overheating.

Figure 1A:
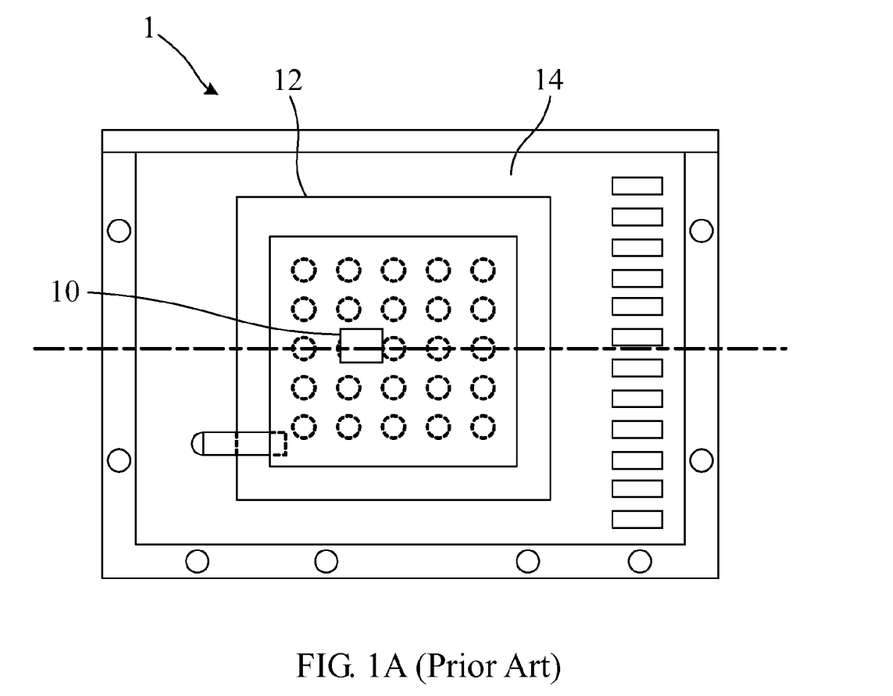
FIG. 1A and FIG. 1B are a top view and a sectional view showing a power transistor element of an electronic device attached to a metal casing via a vapor chamber in the prior art, respectively.
Figure 1B:
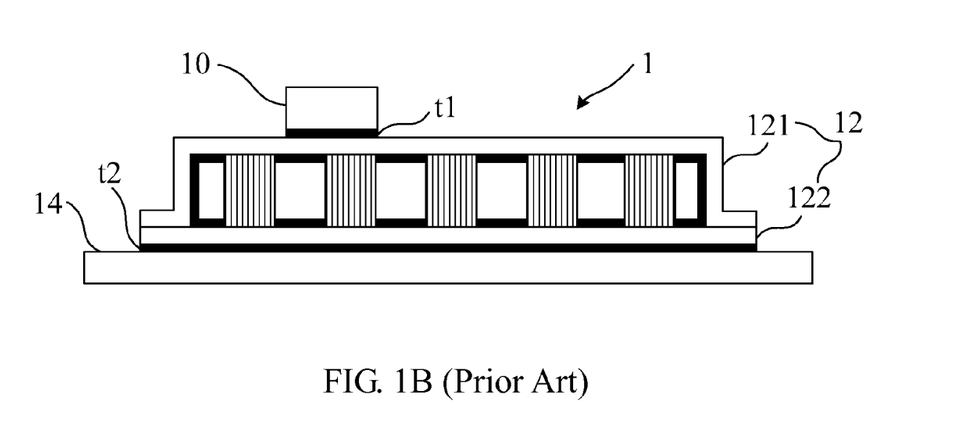

FIG. 1A and FIG. 1B are a top view and a sectional view showing a power transistor element of an electronic device attached to a metal casing via a vapor chamber in the prior art, respectively. In FIG. 1A and FIG. 1B, heat generated by a power transistor element 10 of an electronic device 1 is transferred to an upper cover 121 (a heating side) of a vapor chamber 12 via a TIM t1.

Then, the vapor chamber 12 greatly transfers the heat to a bottom plate 122 (a cooling side) of the vapor chamber 12 via a phase change of a working fluid in the vapor chamber 12 between liquid phase and gas phase. The bottom plate 122 of the vapor chamber 12 then transfers the heat to a metal casing 14 of the electronic device 1 via a TIM t2. Thereby, the heat can be dissipated through a greater heat dissipating area of the metal casing 14, thus to reduce a common partial high-temperature condition in the electronic device 1. However, the heat dissipating mode in the conventional electronic device 1 still has a great of disadvantages.

For example, the heat generated by the power transistor element 10 of the electronic device 1 needs to be transferred to the vapor chamber 12 via the TIM t1, and the vapor chamber 12 also needs the TIM t2 to transfer the heat to the metal casing 14. Thermal resistance is greater since thermal conductivity of the TIM t1 and t2 is lower. In addition, since a contact surface between the power transistor element 10 and the TIM t1, between the TIM t1 and the vapor chamber 12, between the vapor chamber 12 and the TIM t2, or between the TIM t2 and the metal casing 14, is not flat or smooth, greater contact thermal resistance may be generated so that the effective thermal conductivity of the electronic device 1 is worse. Therefore, the heat generated by the power transistor element 10 of the electronic device 1 fails to be effectively dissipated, and the operating temperature thereof is still higher, which greatly reduces reliability and the lifespan of the electronic device 1.

BRIEF SUMMARY OF THE INVENTION

This invention provides a vapor chamber and a method for manufacturing the same to improve the prior art.

In one embodiment of the invention, a vapor chamber is provided. In the embodiment, the vapor chamber is used in an electronic device. The electronic device includes a metal casing. The vapor chamber includes an upper cover, a working fluid, a waterproof layer, and a wick structure layer. The upper cover is disposed on inner walls of the metal casing of the electronic device to define a containing space. The working fluid is filled into the containing space. The waterproof layer is formed on inner walls of the containing space. The wick structure layer is formed on the waterproof layer.

In a practical application, the working fluid may be water; the wick structure layer may be a powder porous wick structure layer; the waterproof layer and the wick structure layer may be made of a material incapable of reacting with the water, respectively. The vapor chamber may further include an electrical-insulating heat-conducting ceramic layer. The electrical-insulating heat-conducting ceramic layer may be formed between the waterproof layer and the inner walls of the containing space. The electrical-insulating heat-conducting ceramic layer, the waterproof layer, and the wick structure layer may be formed on the inner walls of the metal casing in order via thermal spray molding.

In another embodiment of the invention, a method for manufacturing a vapor chamber is provided. In the method, first, an upper cover is formed on inner walls of a metal casing of an electronic device to define a containing space. Afterwards, a waterproof layer is formed on inner walls of the containing space. Then, a wick structure layer is formed on the waterproof layer. Then, the working fluid is filled into the containing space. Finally, the containing space is degassed and sealed.

Compared with the prior art, the vapor chamber and the metal casing of the electronic device are integrated according to the vapor chamber and the method for manufacturing the same in the present invention. That is, the metal casing of the electronic device is used as a base of the vapor chamber. Therefore, a thermal interface material with lower thermal conductivity used between the vapor chamber and the metal casing in the prior art can be omitted. Besides being capable of saving a cost of the thermal interface material and the base of the vapor chamber, thermal resistance can be reduced to improve the effective thermal conductivity.

In the present invention, the electrical-insulating heat-conducting ceramic layer, the waterproof layer, and the powder porous wick structure layer can be further formed on the inner walls of the vapor chamber in order via thermal spray molding, to allow the vapor chamber to be capable of using water with better liquid transport factor at a normal temperature as the working fluid for cooling, thereby greatly improving a heat dissipating effect of the vapor chamber. Further, the vapor chamber can be prevented from electrochemistry corrosion caused by standard potential difference between different materials by forming the electrical-insulating heat-conducting ceramic layer.

These and other features, aspects, and advantages of the present invention will become better understood with regard to the following description, appended claims, and accompanying drawings.

DETAILED DESCRIPTION OF THE INVENTION

In one embodiment of this invention, a vapor chamber is provided. In a practical application, the vapor chamber is used in an electronic device and is integrated with a metal casing of the electronic device. The electronic device can be a digital camera, a cell phone, a notebook computer, or a desktop computer. However, the invention is not limited thereto. The metal casing can be made of a material selected from a group consisting of aluminum-magnesium alloy, aluminum alloy, magnesium alloy, aluminum, steel, and iron. However, the invention is not limited thereto.

Figure 2:
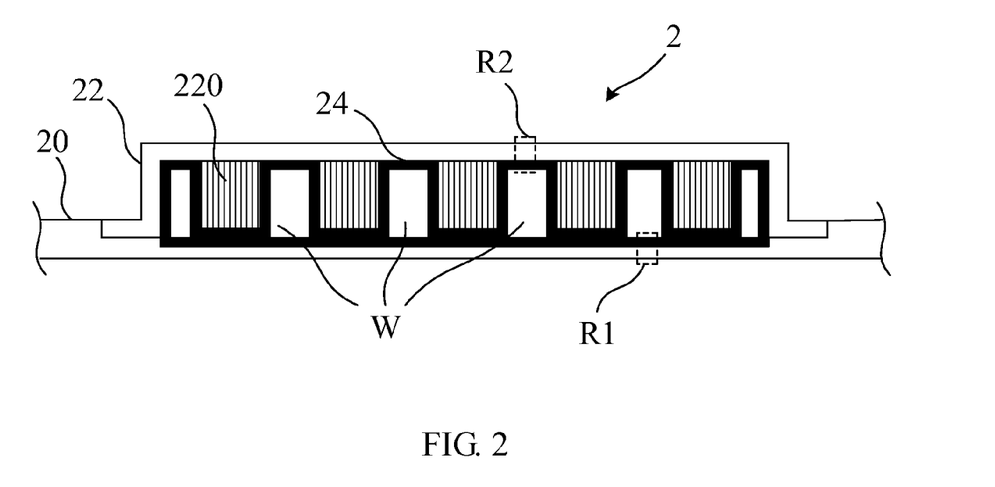
FIG. 2 is a sectional view showing a vapor chamber according to one embodiment of the invention.

FIG. 2 is a sectional view showing a vapor chamber according to the embodiment of the invention. In FIG. 2, an upper cover 22 of a vapor chamber 2 is disposed on inner walls of a metal casing 20 of an electronic device to define a containing space. A thermal spray layer 24 is formed on inner walls of the containing space. In detail, the thermal spray layer 24 is formed on the metal casing 20 and inner walls of the upper cover 22 of the vapor chamber 2 to cover the containing space by the thermal spray layer 24. The aforementioned containing space is then filled with water W as a working fluid of the vapor chamber 2. The upper cover 22 is made of metal selected from a group consisting of aluminum-magnesium alloy, aluminum alloy, magnesium alloy, aluminum, steel, and iron, and the material of the upper cover 22 can be the same as or different from that of the metal casing 20. However, the invention is not limited thereto.

In addition, the vapor chamber 2 can further include supporting plates 220, such as rib plates in FIG. 2. However, the invention is not limited thereto. The thermal spray layer 24 is also formed on surfaces of the supporting plates 220, and the supporting plates 220 are against between the upper cover 22 and the metal casing 20 for strengthening and supporting the whole vapor chamber 2. The number and places of the supporting plates 220 at the vapor chamber 2 can be set according to actual needs. However, the invention is not limited thereto.

Figure 3A:
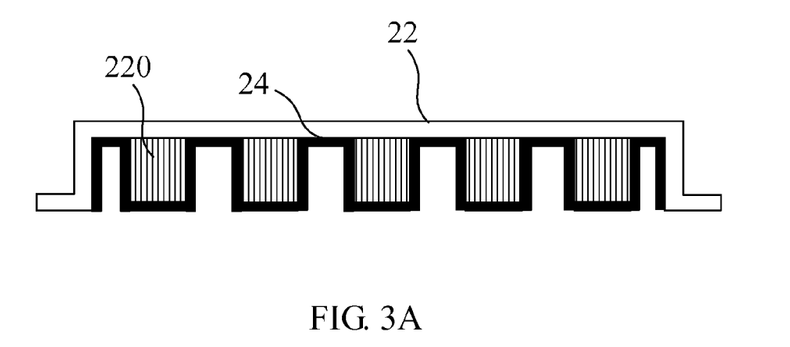
FIG. 3A and FIG. 3B are sectional views showing an upper cover of the vapor chamber and a metal casing of an electronic device in FIG. 2, respectively.
Figure 3B:
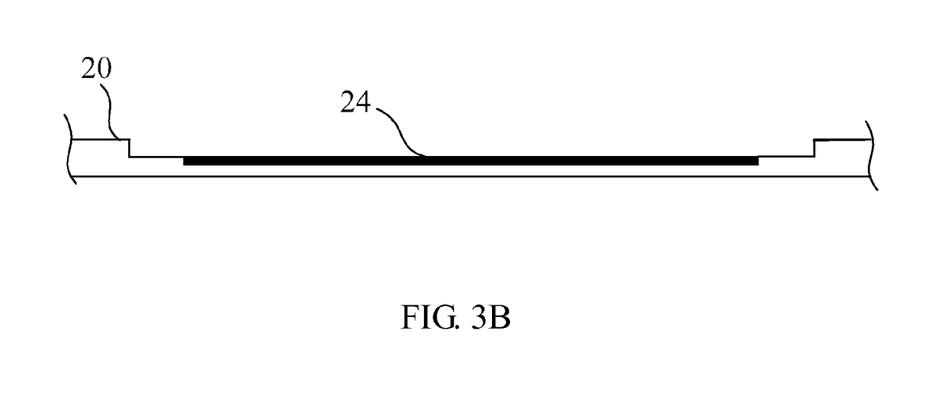

Then, FIG. 3A and FIG. 3B are sectional views showing the upper cover 22 of the vapor chamber 2 and the metal casing 20 of the electronic device in FIG. 2, receptively. In FIG. 3A, the thermal spray layer 24 is formed on the inner walls of the upper cover 22 and the surfaces of the supporting plates 220 to allow the inner walls of the upper cover 22 and the surfaces of the supporting plates 220 to be covered by the thermal spray layer 24.

In FIG. 3B, the thermal spray layer 24 is also formed on the inner walls of the metal casing 20 of the electronic device, and the thermal spray layer 24 is formed to cover a recess of the inner walls of the metal casing 20 such that the surface of the thermal spray layer 24 formed on the metal casing 20 is at the same level with the inner walls of the adjacent metal casing 20. However, the invention is not limited thereto.

Figure 4A:
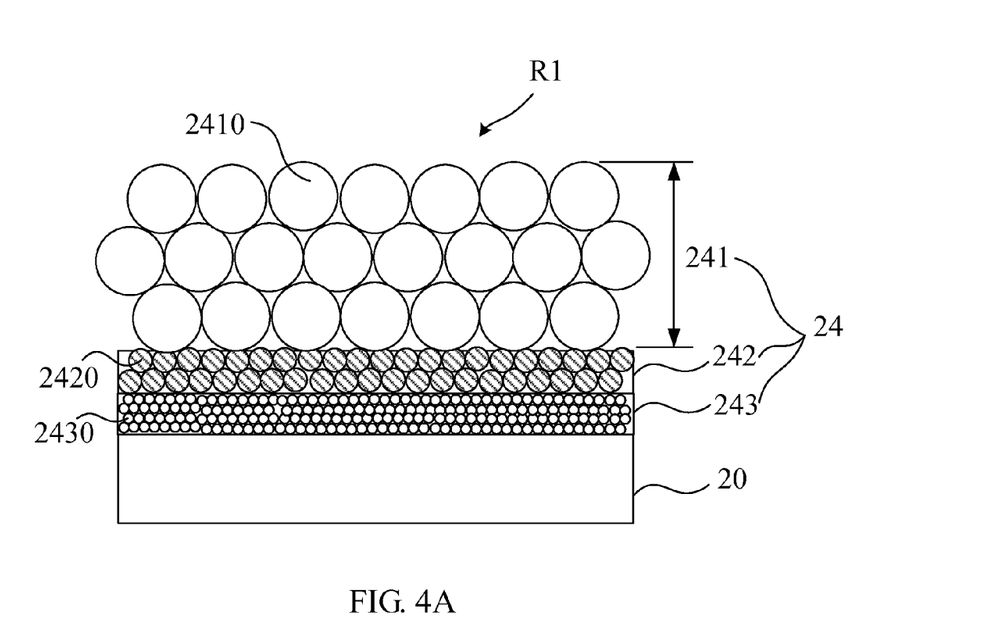
FIG. 4A is an enlarged view showing an area R1 in FIG. 2.

Then, FIG. 4A is an enlarged view showing an area R1 in FIG. 2. In FIG. 4A, at the area R1, the thermal spray layer 24 formed on the inner walls of the metal casing 20 includes a wick structure layer 241, a waterproof layer 242, and an electrical-insulating heat-conducting ceramic layer 243. The electrical-insulating heat-conducting ceramic layer 243, the waterproof layer 242, and the wick structure layer 241 are formed on the inner walls of the metal casing 20 in order via thermal spray molding. That is, the electrical-insulating heat-conducting ceramic layer 243 is first formed on the inner walls of the metal casing 20; then the waterproof layer 242 is formed on the electrical-insulating heat-conducting ceramic layer 243; finally the wick structure layer 241 is formed on the waterproof layer 242.

In a practical application, the thermal spray molding may be thermal spray molding in different forms such as plasma spray, arc spray, flame spray, or high velocity oxy-fuel spray and so on, and the thermal spray molding can be performed at a high temperature or a low temperature. However, the invention is not limited thereto.

A spray material used in the thermal spray molding is selected from metal or ceramic chemically compatible with and incapable of reacting with the working fluid of the vapor chamber 2. In the embodiment, since the vapor chamber 2 uses the water as the working fluid, during the thermal spray molding, the spray material chemically compatible with and incapable of reacting with the water is used. For example, the spray material forming the thermal spray layer 24 may be copper, brass, nickel, or titanium. However, the invention is not limited thereto.

The objective of forming the electrical-insulating heat-conducting ceramic layer 243 on the inner walls of the metal casing 20 is to avoid electrochemistry corrosion, i.e. Galvanic corrosion, caused by standard potential difference between different matters. In the embodiment, after the spray material forming the electrical-insulating heat-conducting ceramic layer 243 is first melted to be liquid, ceramic powder particles 2430 with a diameter of 10 to 500 nm are then blown by high pressure gas and are sprayed and stacked on the inner walls of the metal casing 20 at a high speed to form the electrical-insulating heat-conducting ceramic layer 243 with a thickness of about 10 to 50 um. However, the invention is not limited thereto.

In a practical application, the electrical-insulating heat-conducting ceramic layer 243 may be made of a material selected from a group consisting of aluminum nitride, alumina, silicon nitride, and boron nitride or be made of other electrical-insulating materials with high heat conductivity. In addition, porosity of the electrical-insulating heat-conducting ceramic layer 243 is less than or equal to 10%, and a size of the ceramic powder particles 2430 forming the electrical-insulating heat-conducting ceramic layer 243 is about 10 to 500 nm. However, the invention is not limited thereto.

In the embodiment, after the spray material forming the waterproof layer 242 is first melted to be liquid, waterproof layer powder particles 2420 with a diameter of 5 to 200 nm are then blown by high pressure gas and are sprayed and stacked on the electrical-insulating heat-conducting ceramic layer 243 at a high speed to form the waterproof layer 242 with a thickness of about 10 to 50 um. Similarly, after the spray material forming the wick structure layer 241 is first melted to be liquid, wick structure layer powder particles 2410 with a diameter of 35 to 250 um are then blown by high pressure gas and are sprayed and stacked on the surface of the waterproof layer 242 at a high speed to form the powder porous wick structure layer 241 with a thickness of about 0.1 to 0.8 mm. However, the invention is not limited thereto.

In FIG. 4A, the thickness of the electrical-insulating heat-conducting ceramic layer 243 formed on the inner walls of the metal casing 20 is equal to that of the waterproof layer 242 formed on the electrical-insulating heat-conducting ceramic layer 243, and the thickness is about 10 to 50 um. However, the invention is not limited thereto. Further, the size of the ceramic powder particles 2430 forming the electrical-insulating heat-conducting ceramic layer 243 is greatly smaller than that of the waterproof layer powder particles 2420 forming the waterproof layer 242. The thickness of the waterproof layer 242 is greatly less than that of the wick structure layer 241 formed on the waterproof layer 242, and the size of the waterproof layer powder particles 2420 forming the waterproof layer 242 is greatly smaller than that of the wick structure layer powder particles 2410 forming the wick structure layer 241.

In addition, porosity of the wick structure layer 241 is about between 30% and 70%, and the porosity of the wick structure layer 241 is greater than that of the waterproof layer 242 which is less than or equal to 2% and that of the electrical-insulating heat-conducting ceramic layer 243 which is less than or equal to 10%. Therefore, compared with the waterproof layer 242 and the electrical-insulating heat-conducting ceramic layer 243, the wick structure layer 241 has greater porosity, and the waterproof layer 242 can effectively prevent the water from contacting and reacting with the electrical-insulating heat-conducting ceramic layer 243 and the inner walls of the metal casing 20 below the waterproof layer 242.

In a practical application, the spray materials forming the waterproof layer 242 and the wick structure layer 241 may be the same (such as copper) or be different (such as nickel and brass, respectively). However, the invention is not limited thereto. The same material is preferred. The electrical-insulating heat-conducting ceramic layer 243 is preferably made of aluminum nitride. However, the invention is not limited thereto.

Figure 4B:
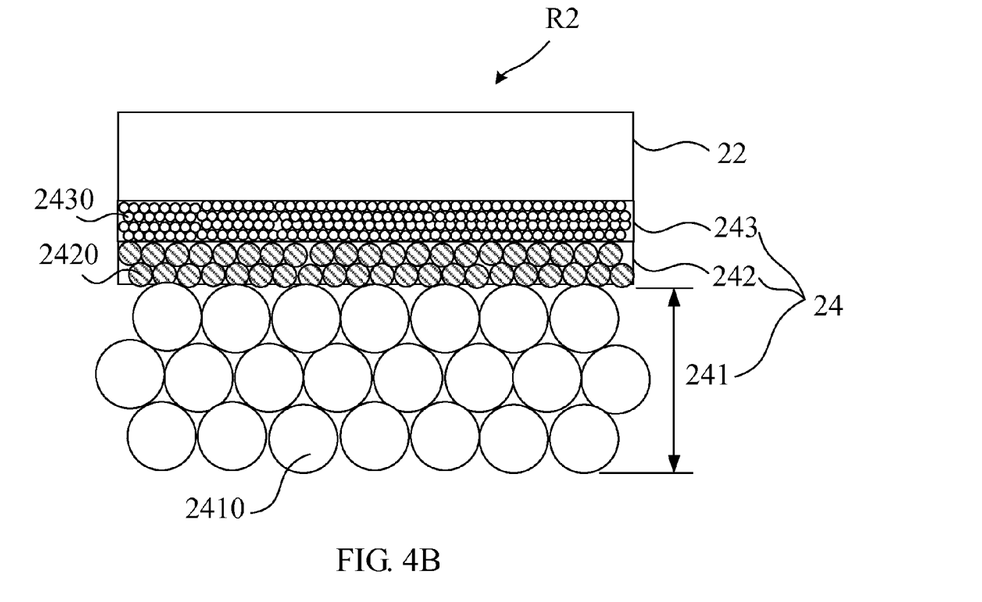
FIG. 4B is an enlarged view showing an area R2 in FIG. 2.

FIG. 4B is an enlarged view showing an area R2 in FIG. 2. In FIG. 4B, at the area R2, the thermal spray layer 24 formed on the inner walls of the upper cover 22 of the vapor chamber 2 includes a wick structure layer 241, a waterproof layer 242, and an electrical-insulating heat-conducting ceramic layer 243. The electrical-insulating heat-conducting ceramic layer 243, the waterproof layer 242, and the wick structure layer 241 are formed on the inner walls of the upper cover 22 in order via thermal spray molding. The detailed structures and forming modes of the wick structure layer 241, the waterproof layer 242, and the electrical-insulating heat-conducting ceramic layer 243 included by the thermal spray layer 24 are the same as the aforementioned embodiment. Therefore, they are not described for a concise purpose.

In another embodiment of the invention, a method for manufacturing a vapor chamber is provided. In a practical application, the vapor chamber manufactured using the method is used in an electronic device, and it is integrated with a metal casing of the electronic device. The electronic device can be a digital camera, a cell phone, a notebook computer, or a desktop computer. However, the invention is not limited thereto. The metal casing can be made of a material selected from a group consisting of aluminum-magnesium alloy, aluminum alloy, magnesium alloy, aluminum, steel, and iron. However, the invention is not limited thereto.

Figure 5:
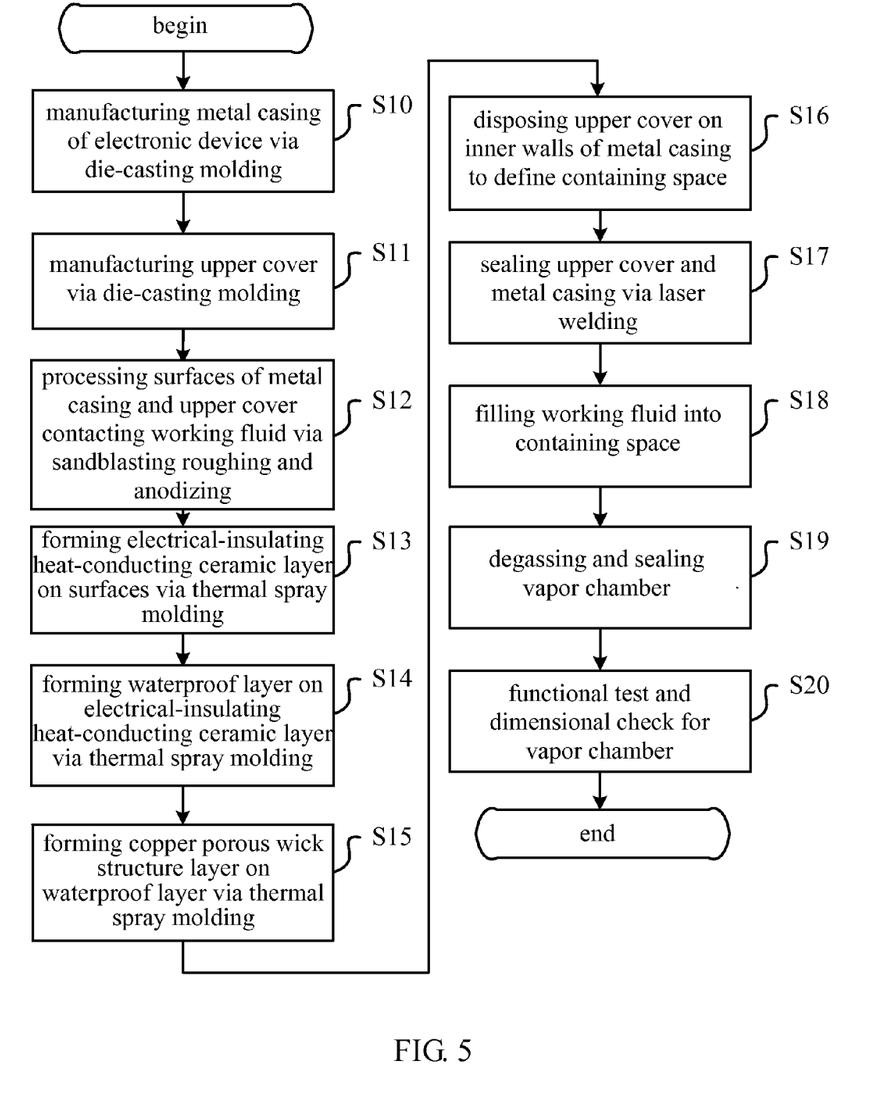
FIG. 5 is a flowchart showing a method for manufacturing a vapor chamber according to another embodiment of the invention.

FIG. 5 is a flowchart showing a method for manufacturing a vapor chamber. In FIG. 5, first step S10 is performed, and a metal casing of the electronic device is manufactured via die-casting molding. Then, step S11 is performed, and an upper cover is manufactured via die-casting molding. Afterwards, step S12 is performed, and surfaces of the metal casing and the upper cover contacting the working fluid are processed via sandblasting roughing and anodizing.

In a practical application, the surfaces contacting the working fluid include the upper cover and the inner walls of the metal casing. That is, in step S12, the upper cover and inner walls of the metal casing are processed via sandblasting roughing and anodizing.

Then, step S13 to step S15 are performed, and an electrical-insulating heat-conducting ceramic layer, a waterproof layer, and a copper porous wick structure layer are formed on the surfaces in order via thermal spray molding. In step S13, the electrical-insulating heat-conducting ceramic layer is formed on the upper cover and the inner walls of the metal casing. In step S14, the waterproof layer is formed on the electrical-insulating heat-conducting ceramic layer. In step S15, the copper porous wick structure layer is formed on the waterproof layer. In a practical application, the thermal spray molding may be thermal spray molding in different forms such as plasma spray, arc spray, flame spray, or high velocity oxy-fuel spray and so on, and the thermal spray molding can be performed at a high temperature or a low temperature. However, the invention is not limited thereto.

A spray material used in the thermal spray molding is selected from metal or ceramic chemically compatible with and incapable of reacting with the working fluid of the vapor chamber. In the embodiment, since the vapor chamber uses water as the working fluid, during the thermal spray molding, the spray material chemically compatible with and incapable of reacting with the water is used. For example, the spray materials forming the electrical-insulating heat-conducting ceramic layer, the waterproof layer, and the copper porous wick structure layer may be copper, brass, nickel, or titanium. However, the invention is not limited thereto.

In step S13, after the spray material forming the electrical-insulating heat-conducting ceramic layer is first melted to be liquid, powder particles with a diameter of 10 to 500 nm are then blown by high pressure gas and are sprayed and stacked on the upper cover and the inner walls of the metal casing at a high speed to form the electrical-insulating heat-conducting ceramic layer with a thickness of 10 to 50 um. However, the invention is not limited thereto.

In a practical application, the electrical-insulating heat-conducting ceramic layer may be made of a material selected from a group consisting of aluminum nitride, alumina, silicon nitride, and boron nitride or may be made of other electrical-insulating materials with high heat conductivity. In addition, porosity of the electrical-insulating heat-conducting ceramic layer is equal to or less than 10%, and a size of the ceramic powder particles forming the electrical-insulating heat-conducting ceramic layer is about 10 to 500 nm. However, the invention is not limited thereto.

In step S14, after the spray material forming the waterproof layer is first melted to be liquid, powder particles with a diameter of 5 to 200 nm are then blown by high pressure gas and are sprayed and stacked on the electrical-insulating heat-conducting ceramic layer at a high speed to form the waterproof layer with a thickness of 10 to 50 um. Similarly, in step S15, after the spray material forming the wick structure layer is first melted to be liquid, powder particles with a diameter of 35 to 250 um are then blown by high pressure gas and are sprayed and stacked on the surface of the waterproof layer at a high speed to form the powder porous wick structure layer with a thickness of 0.1 to 0.8 mm. However, the invention is not limited thereto.

In the embodiment, the thickness of the electrical-insulating heat-conducting ceramic layer is equal to that of the waterproof layer formed on the electrical-insulating heat-conducting ceramic layer, and the thickness is about 10 to 50 um. However, the invention is not limited thereto. Further, the size of the ceramic powder particles forming the electrical-insulating heat-conducting ceramic layer is greatly smaller than that of the powder particles forming the waterproof layer. The thickness of the waterproof layer is greatly less than that of the wick structure layer formed on the waterproof layer, and the size of the powder particles forming the waterproof layer is greatly smaller than that of the powder particles forming the wick structure layer.

In addition, porosity of the wick structure layer is about between 30% and 70%, and the porosity of the wick structure layer is greater than that of the waterproof layer which is less than or equal to 2% and that of the electrical-insulating heat-conducting ceramic layer which is less than or equal to 10%. Therefore, compared with the waterproof layer and the electrical-insulating heat-conducting ceramic layer, the wick structure layer has greater porosity, and the waterproof layer can effectively prevent the water from contacting and reacting with the electrical-insulating heat-conducting ceramic layer and the inner walls of the metal casing below the waterproof layer.

In a practical application, the spray materials forming the waterproof layer and the wick structure layer are the same material (such as copper) or different materials (such as nickel and brass, respectively). However, the invention is not limited thereto. The same material is preferred. The electrical-insulating heat-conducting ceramic layer is preferably made of aluminum nitride. However, the invention is not limited thereto.

Afterwards, step S16 is performed, and the upper cover is disposed on the inner walls of the metal casing to define the containing space. Then, step S17 is performed, and the upper cover and the metal casing are sealed via laser welding. Afterwards, step S18 is performed, and the working fluid is filled into the containing space. Finally, step S19 and step S20 are performed, the vapor chamber is degassed via vacuum pumping and sealed, and a functional test and dimensional check is performed for the vapor chamber.

To sum up, compared with the prior art, according to the vapor chamber and the method for manufacturing the same in the embodiment of the invention, the vapor chamber and the metal casing of the electronic device are integrated, and the metal casing of the electronic device is used as a base of the vapor chamber, thereby being capable of omitting the thermal interface material with lower thermal conductivity used between the vapor chamber and the metal casing in the prior art. Besides being capable of saving a cost of the thermal interface material and a base of the vapor chamber, the thermal resistance can be reduced to improve the effective thermal conductivity of the whole.

In addition, the electrical-insulating heat-conducting ceramic layer, the waterproof layer, and the powder porous wick structure layer are formed on the inner walls of the vapor chamber in order via thermal spray molding, such that the vapor chamber can use the water with better liquid transport factor at a normal temperature as a working fluid for cooling, thereby greatly improving a heat dissipating effect of the vapor chamber integrated with the metal casing. Further, by forming the electrical-insulating heat-conducting ceramic layer, the vapor chamber can be prevented from electrochemistry corrosion caused by standard potential difference between different materials.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A vapor chamber used in an electronic device, the electronic device including a metal casing, the vapor chamber comprising:
an upper cover disposed on inner walls of the metal casing of the electronic device to define a containing space;
a working fluid filled into the containing space;
a waterproof layer formed on inner walls of the containing space;
a wick structure layer formed on the waterproof layer; and
an electrical-insulating heat-conducting ceramic layer formed between the waterproof layer and the inner walls of the containing space;
wherein the electrical-insulating heat-conducting ceramic layer, the waterproof layer and the wick structure layer are sequentially formed on the inner walls of the metal casing via thermal spray molding to avoid reactions of the working fluid, the electrical-insulating heat-conducting ceramic layer, the waterproof layer, and the wick structure layer as well as to avoid an electrochemistry corrosion caused by standard potential differences of the electrical-insulating heat-conducting ceramic layer, the waterproof layer and the wick structure layer,
wherein porosity of the electrical-insulating heat-conducting ceramic layer is less than or equal to 10%, porosity of the waterproof layer is less than or equal to 2%, and porosity of the wick structure layer is between 30% and 70%.

2. The vapor chamber according to claim 1, wherein the electrical-insulating heat-conducting ceramic layer is made of a material selected from a group consisting of aluminum nitride, alumina, silicon nitride, and boron nitride.

3. The vapor chamber according to claim 1, wherein the metal casing is made of a material selected from a group consisting of aluminum-magnesium alloy, aluminum alloy, magnesium alloy, aluminum, steel, and iron.

4. The vapor chamber according to claim 1, wherein the upper cover is made of metal selected from a group consisting of aluminum-magnesium alloy, aluminum alloy, magnesium alloy, aluminum, steel, and iron.

5. The vapor chamber according to claim 1, wherein the working fluid is water.

6. The vapor chamber according to claim 5, wherein the waterproof layer and the wick structure layer are made of a material incapable of reacting with the water, and the material is selected from a group consisting of copper, brass, nickel, and titanium.

7. The vapor chamber according to claim 1, wherein the wick structure layer is a powder porous wick structure layer.

8. The vapor chamber according to claim 1, wherein the wick structure layer is thicker than the waterproof layer.

9. A method for manufacturing a vapor chamber comprising the following steps of:
forming an upper cover on inner walls of a metal casing of an electronic device to define a containing space;
forming a waterproof layer on inner walls of the containing space;
forming a wick structure layer on the waterproof layer;
filling a working fluid into the containing space; and
sealing the containing space,
wherein porosity of the electrical-insulating heat-conducting ceramic layer is less than or equal to 10%, porosity of the waterproof layer is less than or equal to 2%, and porosity of the wick structure layer is between 30% and 70%.

10. The method for manufacturing a vapor chamber according to claim 9, further comprising the following step of:
forming an electrical-insulating heat-conducting ceramic layer between the waterproof layer and the inner walls of the containing space.

11. The method for manufacturing a vapor chamber according to claim 10, wherein the step of forming the electrical-insulating heat-conducting ceramic layer between the waterproof layer and the inner walls of the containing space is completed via thermal spray molding.

12. The method for manufacturing a vapor chamber according to claim 10, wherein the electrical-insulating heat-conducting ceramic layer is made of a material selected from a group consisting of aluminum nitride, alumina, silicon nitride, and boron nitride.

13. The method for manufacturing a vapor chamber according to claim 9, wherein the step of forming the waterproof layer on the inner walls of the containing space and the step of forming the wick structure layer on the waterproof layer are completed via thermal spray molding.

14. The method for manufacturing a vapor chamber according to claim 9, wherein the metal casing is made of a material selected from a group consisting of aluminum-magnesium alloy, aluminum alloy, magnesium alloy, aluminum, steel, and iron.

15. The method for manufacturing a vapor chamber according to claim 9, wherein the upper cover is made of metal selected from a group consisting of aluminum-magnesium alloy, aluminum alloy, magnesium alloy, aluminum, steel, and iron.

16. The method for manufacturing a vapor chamber according to claim 9, wherein the working fluid is water.

17. The method for manufacturing a vapor chamber according to claim 16, wherein the waterproof layer and the wick structure layer are made of a material incapable of reacting with the water, and the material is selected from a group consisting of copper, brass, nickel, and titanium.

18. The method for manufacturing a vapor chamber according to claim 9, wherein the wick structure layer is a powder porous wick structure layer.

19. The method for manufacturing a vapor chamber according to claim 9, wherein the wick structure layer is thicker than the waterproof layer.

* * * * *